(12) United States Patent
Ojima et al.

(10) Patent No.: US 6,963,024 B2
(45) Date of Patent: Nov. 8, 2005

(54) SOLAR CELL MODULE AND ITS INSTALLING MODULE

(75) Inventors: Satoyuki Ojima, Annaka (JP); Hiroyuki Ohtsuka, Annaka (JP); Masatoshi Takahashi, Annaka (JP); Takenori Watabe, Annaka (JP); Takao Abe, Annaka (JP)

(73) Assignees: Shin-Etsu Handotai Co., Ltd., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/250,529

(22) PCT Filed: Jan. 30, 2002

(86) PCT No.: PCT/JP02/00703

§ 371 (c)(1),
(2), (4) Date: Jul. 2, 2003

(87) PCT Pub. No.: WO02/061848

PCT Pub. Date: Aug. 8, 2002

(65) Prior Publication Data

US 2004/0060590 A1 Apr. 1, 2004

(30) Foreign Application Priority Data

Feb. 1, 2001 (JP) .................................. 2001-025681
Mar. 19, 2001 (JP) .................................. 2001-79527

(51) Int. Cl.[7] ............................................. H01L 31/042

(52) U.S. Cl. ................. 136/246; 136/244; 136/256; 136/259; 136/251; 257/466; 257/465; 257/436; 438/71; 438/73; 438/80; 438/67

(58) Field of Search .................... 136/246, 244, 136/256, 259, 251; 257/466, 465, 436; 438/71, 73, 80, 67

(56) References Cited

U.S. PATENT DOCUMENTS 3,411,952 A * 11/1968 Ross et al. .................. 136/244
3,419,434 A * 12/1968 Colehower .................. 136/246

(Continued)

FOREIGN PATENT DOCUMENTS

| DE | 4033658 A1 | 4/1992 |
| EP | 0905794 A3 | 3/1999 |
| JP | 56-64252 | 6/1981 |
| JP | 3-79087 | 4/1991 |
| JP | 3-79087 A * | 4/1991 |
| JP | 6-82865 | 11/1994 |
| JP | 7-30139 A * | 1/1995 |

OTHER PUBLICATIONS

Hezel et al, "A New Strategy for the Fabrication of Cost-Effective Silicon Solar Cells", Renewable Energy, vol. 14, Nos. 1–4, pp. 83–88, (1998).*

(Continued)

*Primary Examiner*—Alan Diamond
(74) *Attorney, Agent, or Firm*—Snider & Associates; Ronald R. Snider

(57) ABSTRACT

A solar cell module 60 has a plurality of solar cells 14 having a plurality of parallel grooves 8 on the individual light-receiving surfaces thereof, each of the grooves having an electrode 5 for extracting output on the inner side face (electrode-forming inner side face) on one side in the width-wise direction thereof; and a support 10, 50 for supporting the solar cells 14 in an integrated manner so as to direct the light-receiving surfaces upward. The annual power output can be increased by adjusting the direction of arrangement of the electrode-forming inner side faces of the grooves 8 while taking the angle of inclination β of the light-receiving surface of the individual as-installed solar cells 14 relative to the horizontal plane and the latitude δ of the installation site of the solar cell module into consideration.

11 Claims, 15 Drawing Sheets

U.S. PATENT DOCUMENTS

| | | | |
|---|---|---|---|
| 4,129,360 A | * 12/1978 | Deflandre et al. | 359/853 |
| 4,152,174 A | * 5/1979 | Ludlow | 136/246 |
| 4,287,382 A | * 9/1981 | French | 136/244 |
| 4,379,944 A | 4/1983 | Borden et al. | |
| 4,410,757 A | * 10/1983 | Stamminger et al. | 136/248 |
| 4,453,030 A | 6/1984 | David et al. | |
| 5,522,943 A | * 6/1996 | Spencer et al. | 136/245 |
| 5,704,992 A | 1/1998 | Willeke et al. | |
| 6,172,297 B1 | * 1/2001 | Hezel et al. | 136/256 |
| 6,201,181 B1 | * 3/2001 | Azzam et al. | 136/244 |
| 2004/0058468 A1 | * 3/2004 | Takahashi et al. | 438/42 |
| 2004/0065362 A1 | * 4/2004 | Watabe et al. | 136/252 |
| 2004/0123897 A1 | * 7/2004 | Ojima et al. | 136/256 |

OTHER PUBLICATIONS

Hezel et al., "A New Strategy for the Fabrication of Cost-Effective Silicon Solar Cells", *Renewable Energy*, May 1998, pp. 83–88, vol. 14, Nos. 1–4.

Hezel et al., "Next Generation of Industrial Silicon Solar Cells with Efficiencies above 20%", Photovoltaic Specialists Conference, 2000. Conference Record of the Twenty–Eighth IEEE, Sep. 2000, p. 184–187.

* cited by examiner

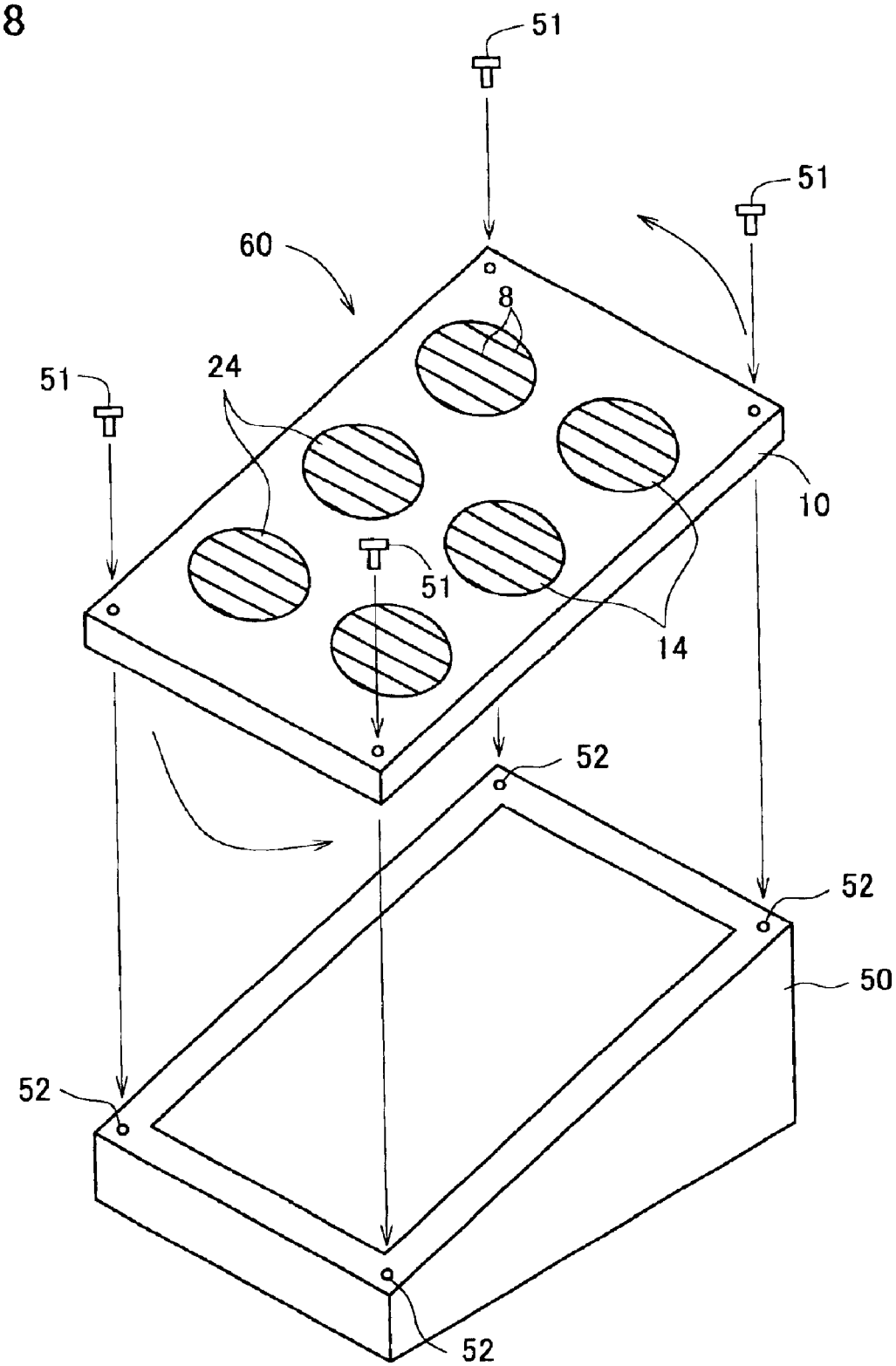

FIG.9

Parameters used in calculation
$\delta$ : latitude
d : date
hr : time of day
$\beta$ : installation angle of solar cell module
$\Psi$ : azimuth of solar cell module
w1: width of projected portion
w2: width of groove
h : depth of groove
t : thickness of electrode
Ps: solar energy density

START

S1 calculate azimuth $\phi'$ ($\delta$,d,hr) and elevation angle $\theta'$ ($\delta$,d,hr) of the sun S2 calculate azimuth $\phi$ ($\delta$,d,hr,$\beta$,$\Psi$) and elevation angle $\theta$ ($\delta$,d,hr,$\beta$,$\Psi$) of the sun as viewed from solar cell module S3 calculate shadowing loss S ($\delta$,d,hr,$\beta$,$\Psi$,w1,w2,h,t)

S4 calculate effective amount of received solar energy Pe ($\delta$,d,hr,$\beta$,$\Psi$,w1,w2,h,t,Ps)

S5 calculate average effective amount of received solar energy Pea ($\delta$,$\beta$,$\Psi$,w1,w2,h,t,Ps)

S6 derive relation between installation angle $\beta$ and average effective amount of received solar energy Pea S7 calculate installation angle $\beta$ which expresses turning point for considering optimum direction of electrode-forming surface at given latitude $\delta$ S8 derive discriminant

END

FIG.20
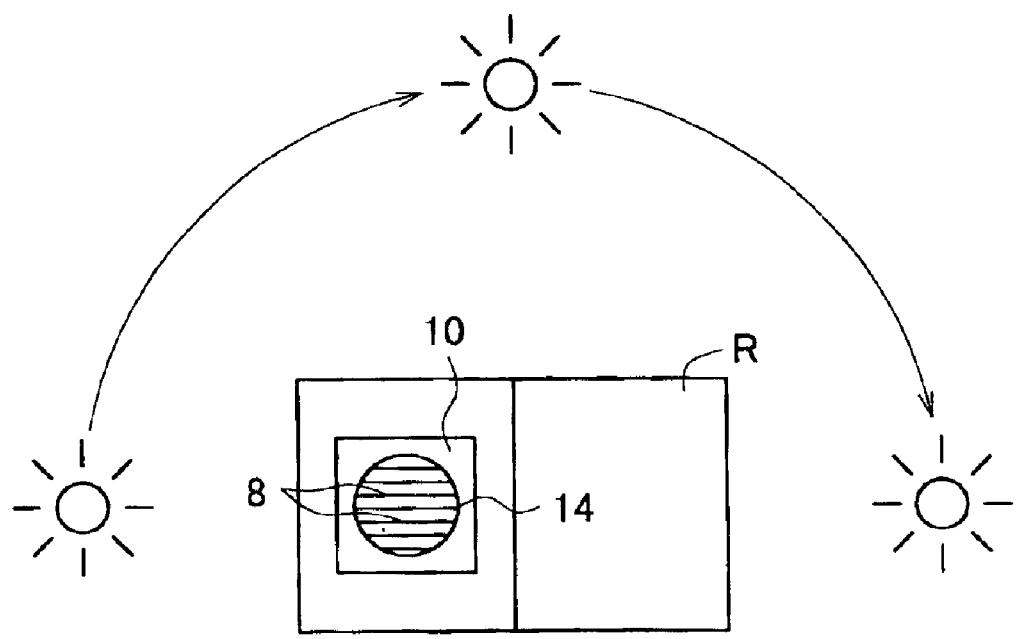
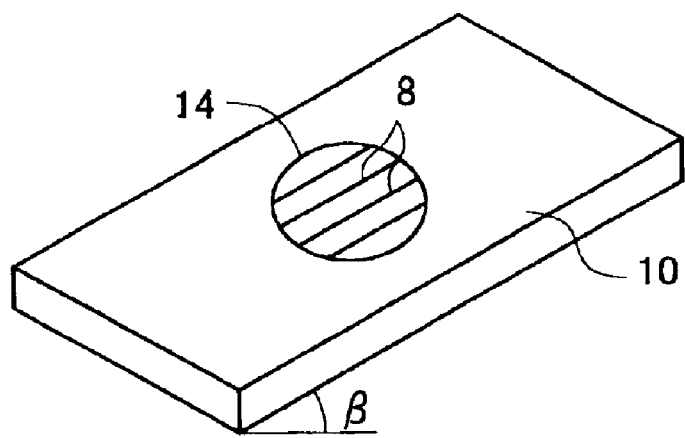

SOLAR CELL MODULE AND ITS INSTALLING MODULE

TECHNICAL FIELD

This invention relates to a solar cell module and a method of installing the solar cell module.

BACKGROUND ART

Solar cells generally have a finger-type electrode on the surface thereof for the purpose of extracting generated power to the external. It is preferable for the electrode to have a larger width or larger thickness in view of improving the generation efficiency, since the larger the sectional area of the electrode becomes, the more the electrode reduces its resistivity. On the contrary, the electrode prevents sunlight from entering the semiconductor material composing the solar cells, and consequently lowers the generation efficiency. The electrode, typically formed by screen printing using an Ag paste, accounts for 8 to 12% of the total area of the light-receiving surface of the solar cells, and shadowing loss ascribable to this is understood as an obstacle to efforts for improving the generation efficiency.

One known method ever developed in order to improve the generation efficiency through reducing the shadowing loss relates to an OECO (obliquely-evaporated contact) solar cell having a plurality of grooves with any section of rectangular, semicircular and triangular forms fabricated on the light-receiving surface thereof, and having electrodes formed on the individual inner side faces of the grooves only on a single side as viewed along the width-wise direction ("Renewable Energy, Vol. 14, Nos. 1–4, 83–88 (1998), European Patent No. EP0905794A2).

Although the OECO solar cell has a great advantage in terms of energy conversion efficiency, the inventors found out through our investigations that modularization of the OECO solar cell raises various new problems which could have not been encountered before, due to its special design such that the electrodes are formed on the inner side faces of the grooves.

Because the OECO solar cell has the electrodes only on one side face of each groove, the shadowed area will vary depending on the angle of incidence of sunlight, and thus the cell inevitably causes variation in the amount of photo-generated current. This is illustrated in FIG. 2. As seen in FIG. 2, a ratio of shadowed area for an angle of incidence of α is given as B/(A+B+C), but that for an angle of incidence of α' is given as B'/(A'+B'+C'). This indicates that smaller angle of incidence increases the shadowing loss.

To maximize the generation efficiency of the solar cell module, it is necessary to equalize output current obtainable from the individual solar cells in the module, and thus it is important to equalize the conversion efficiency of the individual solar cells. The OECO solar cell module is, however, not always successful in equalizing the output current from the individual solar cells even if it is configured using solar cells having a uniform basic performance, and even the cells are uniformly irradiated by sunlight. It is because severity of the shadowing loss may differ from cell to cell and the output current may be non-uniform under an oblique incidence of sunlight if no special attention is paid on the direction of attachment of the individual cells in the module.

Considering now that solar cell modules are generally installed on the roof of houses or buildings, and that the OECO solar cell has electrodes only on a single side face of each groove and shows the shadowing loss variable depending on the angle of incidence of sunlight as described in the above, another disadvantage arises that total of daily or annual power output may differ depending on the direction to which the electrode-forming surfaces are directed, and this may prevent performance of the solar cell module from being fully exhibited.

It is therefore a subject of the invention to provide a solar cell module in which output current from the individual solar cells composing the module are equalized even under oblique incidence of sunlight, and a method of effectively installing thus-composed module.

DISCLOSURE OF THE INVENTION

As a solution to the aforementioned subject, the solar cell module of the invention comprises a plurality of solar cells having a plurality of parallel grooves on the individual light-receiving surfaces thereof, each of the grooves having an electrode for extracting output on the inner side face (referred to as electrode-forming inner side face, hereinafter) on one side in the width-wise direction thereof; and a support for supporting the solar cells in an integrated manner so as to direct the light-receiving surfaces upward; wherein the plurality of solar cells are attached to the support so that the longitudinal directions of the grooves nearly coincide with each other, and so that the electrode-forming inner side faces are arranged on the same side.

Thus-configured solar cells used for the solar cell module of the invention correspond to the aforementioned OECO solar cell. Because the plurality of solar cells are attached to the support so that the longitudinal directions of the grooves nearly coincide with each other, and so that the electrode-forming inner side faces are arranged on the same side, sunlight can irradiate the electrode-forming inner side surfaces of the individual solar cells at the same angle even under oblique incidence. This is successful in approximately equalizing shadowing loss which possibly occurs in the individual solar cells, and in equalizing the output current.

Taking convenience in fabrication of the grooves into consideration, each groove of the solar cell preferably has any section of rectangular, semicircular and triangular forms.

The invention is also to provide a method of installing the solar cell module of the invention. More specifically, the direction of arrangement of the electrode-forming inner side faces of the grooves of the individual solar cells are adjusted depending on the angle of inclination β of the light-receiving surfaces of the individual as-installed solar cells away from the horizontal plane, and on the latitude δ of the installation site of the solar cell module.

Examinations by the inventors have revealed that the OECO solar cell, having the electrode-forming inner side face only on a single side face of each groove, showed completely different patterns of intensity of sunlight coming into the electrode, severity of the shadowing, and daily or annual variation thereof depending on the attitude of the module or on the latitude of the installation site. Whereas the invention succeeded in fully expressing performances of the solar cell module, and, as a consequence, in increasing the daily or annual power generation of the solar cell module, by defining an angle of inclination β of the light-receiving surfaces of the individual solar cells away from the horizontal plane as the attitude of the module, and by adjusting the direction of arrangement of the electrode-forming inner side faces depending on p and the latitude δ of the installation site.

BRIEF DESCRIPTION OF DRAWINGS

FIG. 8 is a schematic view showing one embodiment of the solar cell module;

FIG. 9 is a flow chart of a process for deriving formulae (1) and (2);

FIG. 20 is a drawing for explaining orientation of the grooves altered depending on aspect of the roof;

BEST MODES FOR CARRYING OUT THE INVENTION

Figure 1:
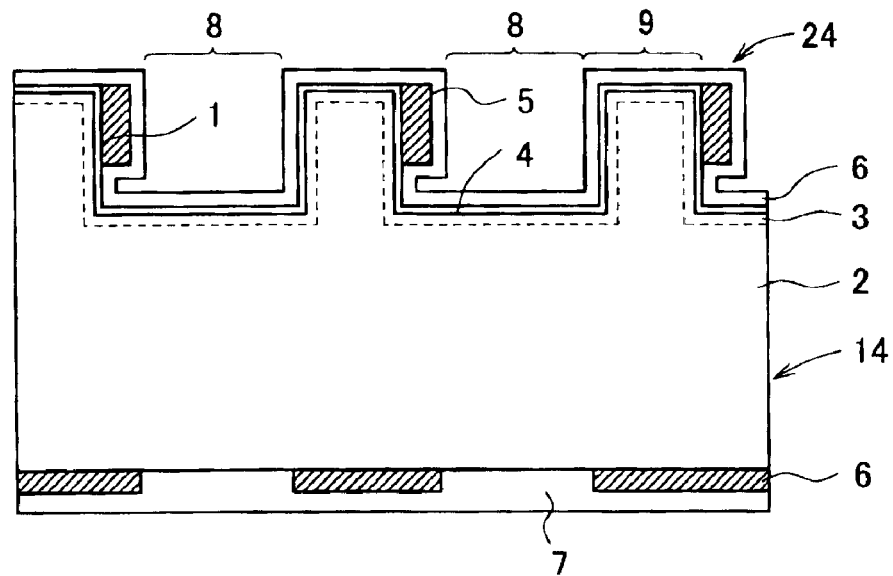
FIG. 1 is a schematic view showing an exemplary sectional structure of an OECO solar cell.

The following paragraphs will describe best modes for carrying out the invention making reference to the attached drawings, where it is to be understood that the invention is by no means limited to these best modes for carrying out the invention. FIG. 1 is a schematic view showing an exemplary sectional structure of a solar cell used for the solar cell module of the invention. The solar cell 14 is configured so that a large number of grooves 8 of approx. several-hundred-micrometers wide and approx. 100 $\mu$m deep are formed in parallel on a first main surface (light-receiving surface) 24 of a p-type silicon single crystal substrate 2 sliced out from a silicon single crystal ingot. These grooves 8 can be carved en bloc using a set of hundreds to thousands of concentrically-jointed rotary blades which rotate all together, where it is also allowable to divide the carving operation into several numbers of the run.

On the first main surface 24 of the substrate 2 having the grooves 8 thus formed thereon, an emitter layer 3 is formed by thermally diffusing phosphorus as an n-type dopant, so as to produce a p-n junction portion. On the emitter layer 3, a thin silicon oxide film 4 which functions as a tunnel insulating film is formed typically by the thermal oxidation process.

On the silicon oxide film 4, electrodes 5 are formed. Each of the electrodes 5 is formed typically by depositing, in a vacuum evaporation apparatus, an electrode material (e.g., a metal such as aluminum) on an inner side face (electrode-forming inner side face) on one side of each groove 8, and this style of deposition is attained by inclining the substrate 2 relative to an evaporation source at a least necessary angle or more, so as to allow the electrode material to deposit on the inner side face predominantly on one side in the widthwise direction of each groove, as described later (this is where the name of OECO came from. It is to be noted that unnecessary portion of the electrode material which deposit also on the top surface of projected portions 9 formed between every adjacent grooves 8, 8 can be removed later by an etching solution such as phosphoric acid solution). The entire surface of the first main surface 24 of the substrate 2, together with the electrodes 5, is covered with a silicon nitride film 6 which serves as a protective layer and an anti-reflection film. On the other hand, the substrate 2 has, also on the back surface thereof, the silicon nitride film 6 and an electrode 7.

Figure 3:
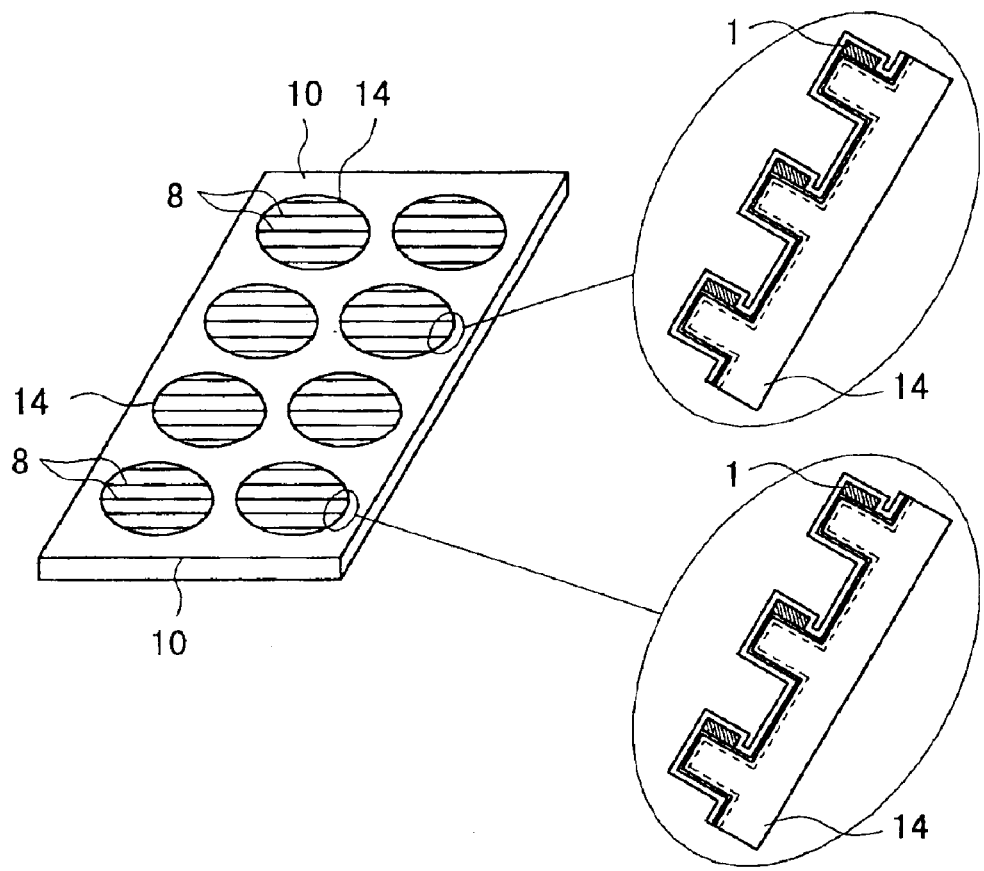
FIG. 3 is a perspective view showing an arrangement pattern of the solar cells in a solar cell module according to the invention.

FIG. 8 shows an exemplary solar cell module using the aforementioned solar cells 14. The solar cell module 60 has a support 50 for supporting a plurality of solar cells 14 in an integrated manner so as to direct the light-receiving surfaces 24 upward. The plurality of solar cells 14 are attached to the support so that the longitudinal directions of the grooves 8 nearly coincide with each other with respect to the bottom edge of the support 50, and so that the electrode-forming inner side faces 1, and more specifically the electrodes 5, of all solar cells 14 are arranged on the same side as shown in FIG. 3.

Direction of arrangement of the electrode-forming inner side faces 1 in the installation of the solar cell module 60 is adjusted typically depending on the angle of inclination β of the light-receiving surfaces 24 away from the horizontal plane, and on the latitude δ of the installation site, in order to optimize the annual power output. In the best mode for carrying out the invention, the plurality of the solar cells 14 are attached to the support 50 (FIG. 8) so that positions of the electrode-forming inner side faces 1 are arbitrarily selected between a first position (FIG. 5) and a second position (FIG. 6) which are in a 180°-inverted positional relation within a plane parallel to the light-receiving surface, for the convenience of carrying out the specific embodiments of the installation method described later.

More specifically, the plurality of solar cells 14 are collectively attached to a cell holding member 10, and the cell holding member 10 is attached to an installation base 50 as the support. Variation in the direction of attachment of the cell holding member 10 to the installation base 50 results in positional changes in the electrode-forming inner side faces 1 (FIG. 3) of the plurality of solar cells 14 collectively between the first position and the second position. Some troubles may, however, arise in the attachment of the solar cells 14 to the cell holding member 10 or to the installation base 50 when the orientation of the grooves 8 formed on the solar cells 14 are not visually recognizable. It is therefore convenient to provide the solar cells 14 with a direction-identifying marking (orientation notch, orientation flat, etc.) which satisfies a predetermined positional relation with the grooves 8.

The cell holding member 10 herein has a form of plate, and the individual solar cells 14 are attached as being aligned with the surface thereof. Angle of inclination β of the cell holding member 10 thus represents angle of inclination of the light-receiving surfaces 24. On the other hand, the installation base 50 has a form of frame, and the cell holding member 10 is attached thereto with the aid of a detachable joining mechanism, which is typified herein by screw holes 52 bored in the installation base 50 and screws penetrating the cell holding member 10 and tightened into the screw holes 52. Direction of the cell holding member 10 can be turned by unscrewing the screws 51, turning the cell holding member 10 in the direction indicated by arrow, and re-tightening the screws 51.

Figure 21:
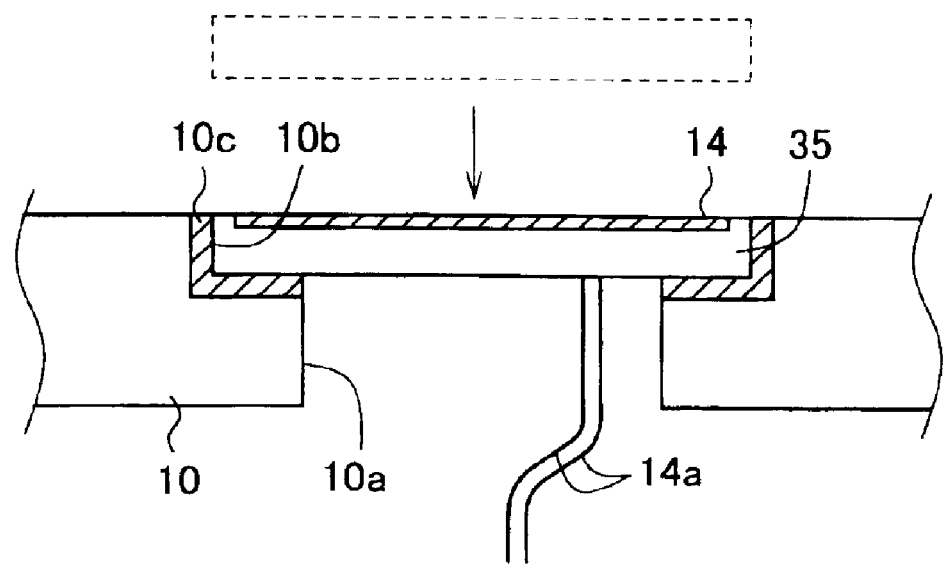
FIG. 21 is a schematic sectional view showing an exemplary constitution of the solar cell module allowing independent adjustment of the direction of the solar cell units.

It is also allowable to attach the plurality of solar cells 14 so that the individual directions thereof can be adjustable in an independent manner. FIG. 21 shows an exemplary configuration therefor. In this example, each solar cell 14 is mounted on a wiring base so as to configure a disk-formed solar cell unit 35, and the solar cell unit 35 is attached to a cell holding portion 10b (a spot-faced recess having a cylindrical inner surface herein) formed in the cell holding member 10 so as to be rotatable around the axial line. Position of the electrode-forming inner side face 1 (FIG. 3) can thus be altered by rotating the solar cell unit 35. The cell holding portion 10b has, on the inner surface thereof, an elastic holding portion 10c typically composed of rubber, so as to support the attachment position of the solar cell unit 35 placed in the cell holding portion 10b under pressure. Output lines 14a of the solar cell unit 35 are drawn out from a through hole 10a which communicates with the cell holding portion 10b.

Figure 4:
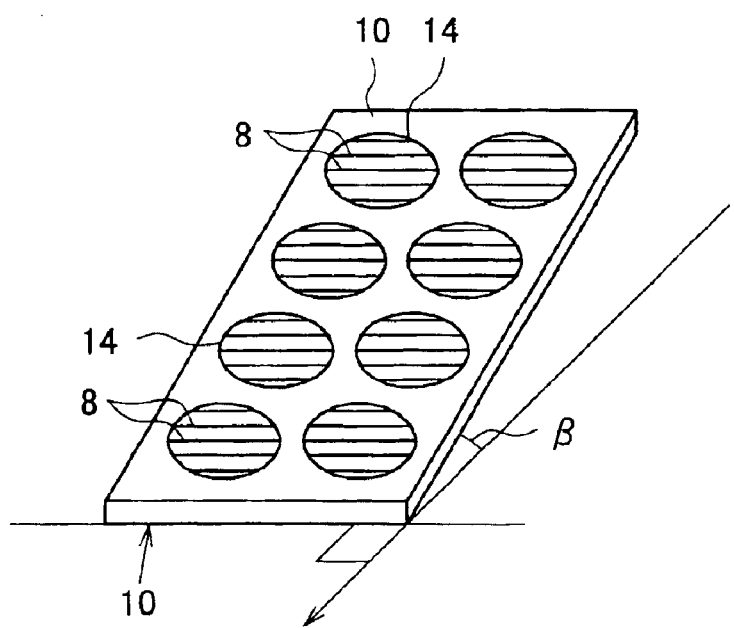
FIG. 4 is a perspective view showing a method of installing the solar cell module according to the invention.
Figure 7:
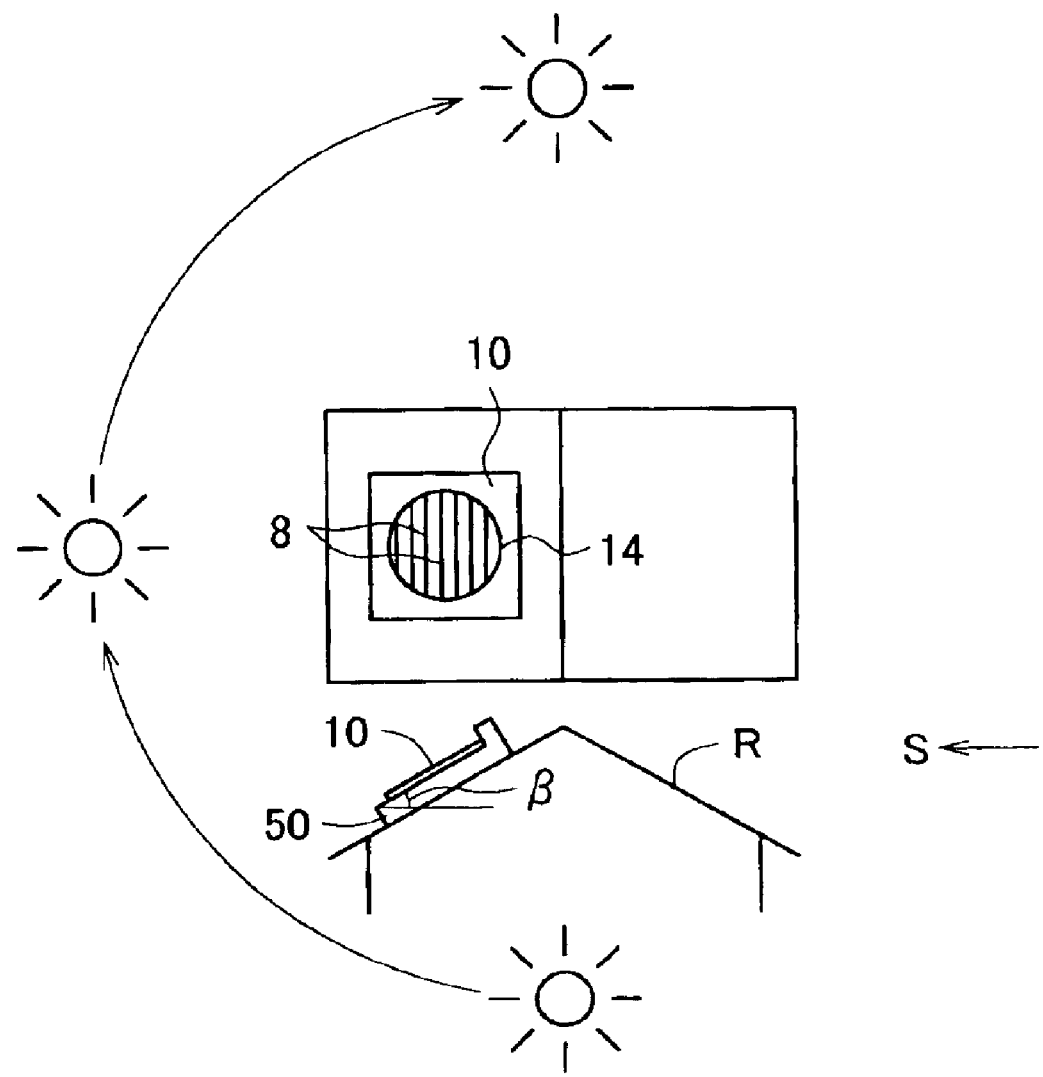
FIG. 7 is a schematic view showing an exemplary installation of the solar cell module on a roof having a south aspect.

In most cases of installing the solar cell module 60 on a roof, it is a general practice to choose the sunny south aspect thereof as an installation site as shown in FIG. 7. Considering now about solar cell power generation using the natural light, an essential point is that how effectively the light can be converted into electric power out of the time zone around the meridian passage abundant in light energy, but rather in the time zones before or after the meridian passage less abundant in the light energy, that is in the morning or in the evening. The shadowing loss becomes more likely to occur when the light is irradiated so that the orthogonal projection thereof on the light-receiving surface crosses the longitudinal direction of the grooves 8, so that it is not desirable for the solar cell to remain in such situation for a long duration in the morning and evening in view of raising the generation efficiency. For an exemplary case where the solar cell module 60 is installed on a roof having northward and southward slopes, the individual solar cells are attached so that the longitudinal direction of the grooves 8 crosses the direction of inclination of the roof at right angles as shown in FIG. 4. This style of attachment can successfully limit the irradiation status causative of a large shadowing loss within the time zone around the meridian passage so as to minimize the influences by the shadowing loss possibly occurs, and on the contrary, can effectively convert sunlight, which is irradiated from the east in the morning or from the west in the evening, into electric power while successfully suppressing the shadowing loss.

Figure 6:
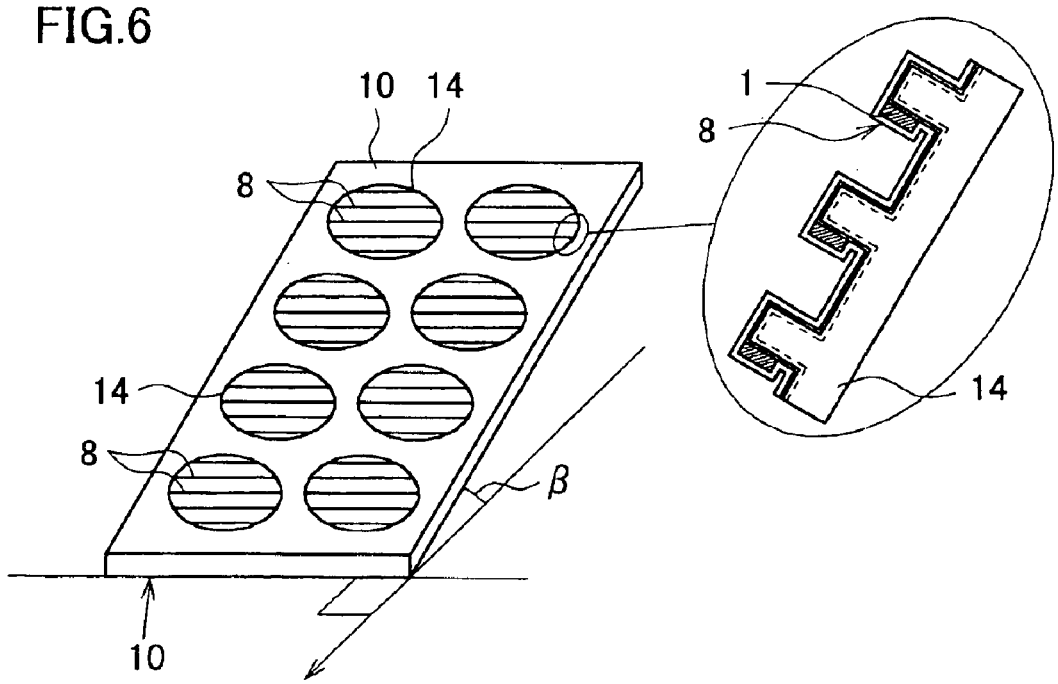
FIG. 6 is a perspective view showing an exemplary installation of the solar cell module while directing the electrode-forming inner side faces downward.

In this case, the solar cells 14 are consequently installed so as to horizontally align the longitudinal direction of the grooves 8. Taking the angle of inclination β of the light-receiving surface and the latitude δ of the installation site into consideration, the inventors extensively investigated into optimum direction of the electrode and found it advantageous to adopt a mode of installation as described below. That is, assuming now that the angle of inclination of the light-receiving surface away from the horizontal plane as β°, and that the latitude of the installation site as δ° (where, the north latitude side is defined as positive), it is defined that the solar cell module is installed so as to direct the electrode-forming inner side faces of the grooves more closer to the equator than the other inner side faces (that is, so as to direct it upward in the direction of inclination) as shown in FIG. 5 when the relation of $$\beta \leq 60 \times |\sin \delta| \quad (1)$$

is satisfied, and vice versa as shown in FIG. 6 when the relation of $$\beta > 60 \times |\sin \delta| \quad (2)$$

is satisfied.

Figure 5:
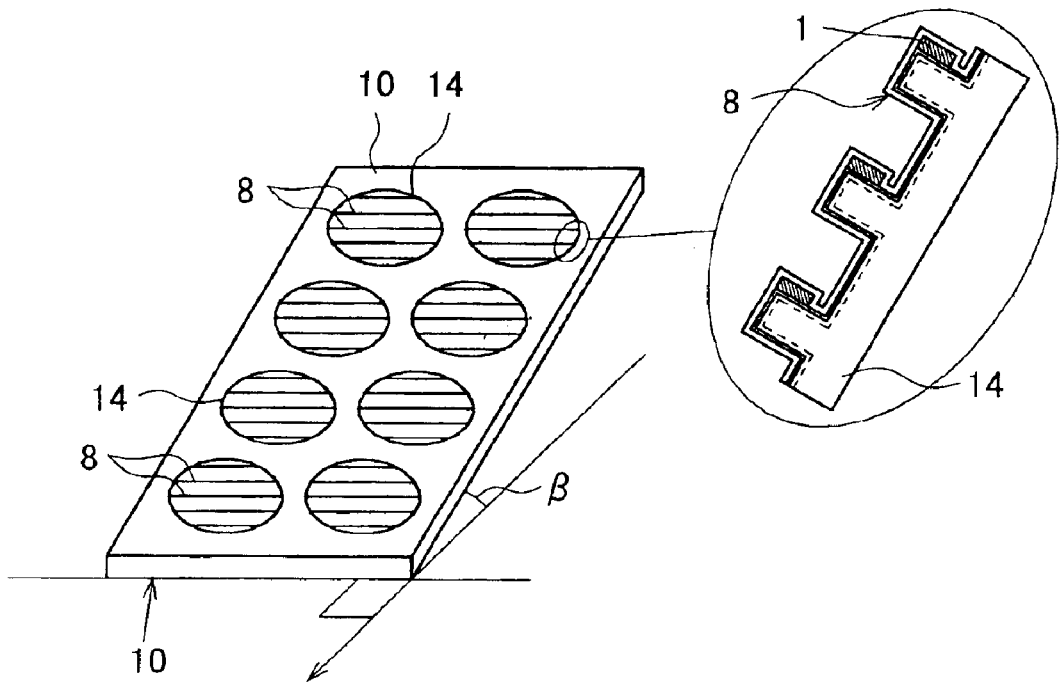
FIG. 5 is a perspective view showing an exemplary installation of the solar cell module while directing the electrode-forming inner side faces upward.
Figure 10:
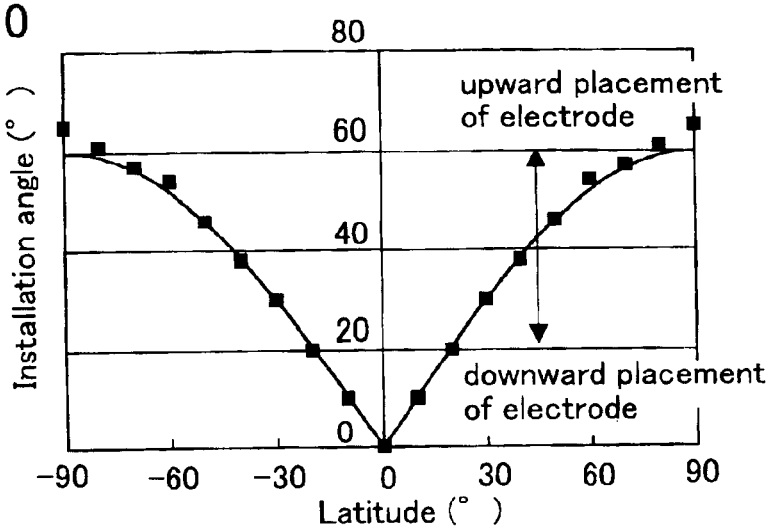
FIG. 10 is a graph showing a relation among latitude of the installation site of the solar cell module, turning-point angle and orientation of the electrode-forming inner side faces.

That is, at a latitude δ where the relation (1) holds, adoption of the installation mode shown in FIG. 5 can raise the annual power output as compared with that attainable by the installation mode shown in FIG. 6, and at latitude δ where the relation (2) holds, adoption of the installation mode shown in FIG. 6 can raise the annual power output as compared with that attainable by the installation mode shown in FIG. 5. The annual power output of the solar cell module 60 can be thus optimized. FIG. 10 shows a graph expressing the conditional relations (1) and (2) in the above. The south latitude side is defined as negative in FIG. 10.

Figure 2:
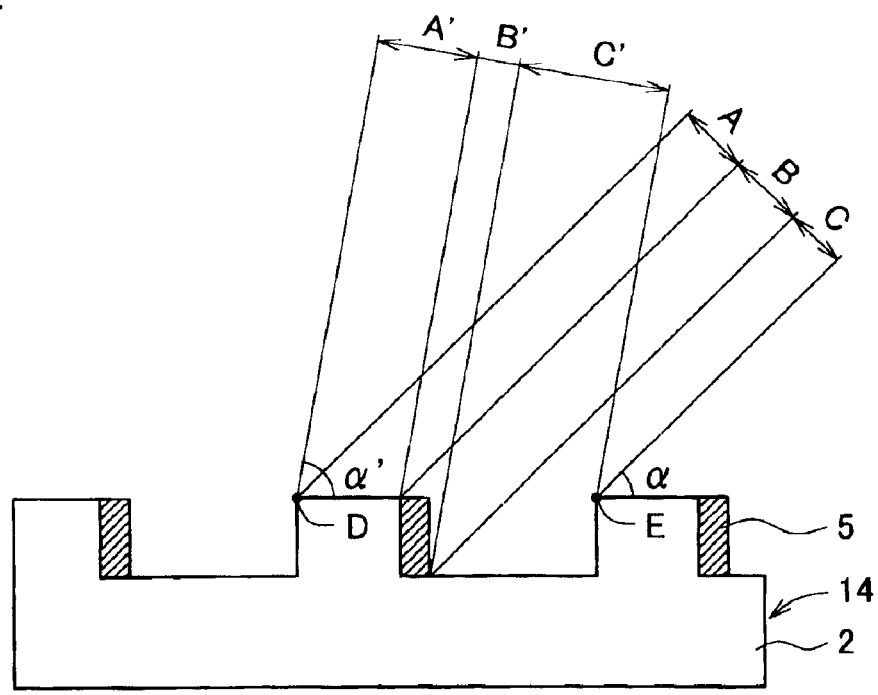
FIG. 2 is an explanatory drawing showing relations among grooves formed on the OECO solar cell, electrodes and sunlight.
Figure 19:
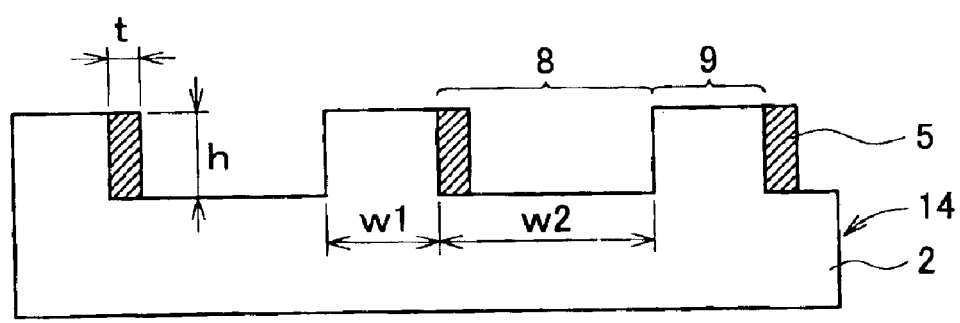
FIG. 19 is a schematic sectional view showing dimensions of the grooves formed on the surface of the solar cell.

The relations (1) and (2) were derived according to the thinking flow shown in FIG. 9. The following paragraphs will detail the process of thinking. First, as shown in FIG. 2, expressions for describing ratio of projected area of the electrode 5 (shadowing loss) are found based on azimuth and elevation angle of the sun, and angle of installation and azimuth of the solar cell module 60. As is clear from FIG. 2, $$B/(A+B+C) \text{ and } B'/(A'+B'+C') \qquad (3)$$

represent the ratio of projected area of the electrode 5. As shown in step S1 in FIG. 9, the azimuth $\phi'$ and elevation angle $\theta'$ of the sun (where, azimuth $\phi'$ is defined while assuming the east aspect in the longitudinal direction of the grooves as 0, and the direction of counter-clock-wise rotation as positive) are expressed as a function of date d, time of day hr and latitude $\delta$. Data for the function can primarily be determined according to calendar. Methods of data acquisition are publicly known in the field of astronomy, and will not be detailed here. Then as shown in step S2, the aforementioned azimuth $\phi'$ and elevation angle $\theta'$ are processed by rotational conversion as much as the angle of inclination $\beta$ of the light-receiving surface (also referred to as installation angle of the solar cell module, or more simply as installation angle), to thereby determine function data which expresses relative azimuth $\phi$ and elevation angle $\theta$ of the sun as viewed from the light-receiving surface (solar cell module). The elevation angle $\theta$ corresponds to the angle of incidence of sunlight on the light-receiving surfaces, and the azimuth $\phi$ corresponds to an angle between the groove 8 and the positive solar projection, so that assuming that all of the thickness (t) of the electrode, depth (h) of the groove, width (w2) of the groove and distance (w1) between the grooves are given as constant parameters as shown in FIG. 19, shadowing loss (S) for each date/hour can be calculated based on the above expressions (3) as functional data of latitude $\delta$ and installation angle $\beta$ by using the aforementioned $\theta$, $\phi$, and shape parameters of the groove (step S3 in FIG. 9).

Figure 23:
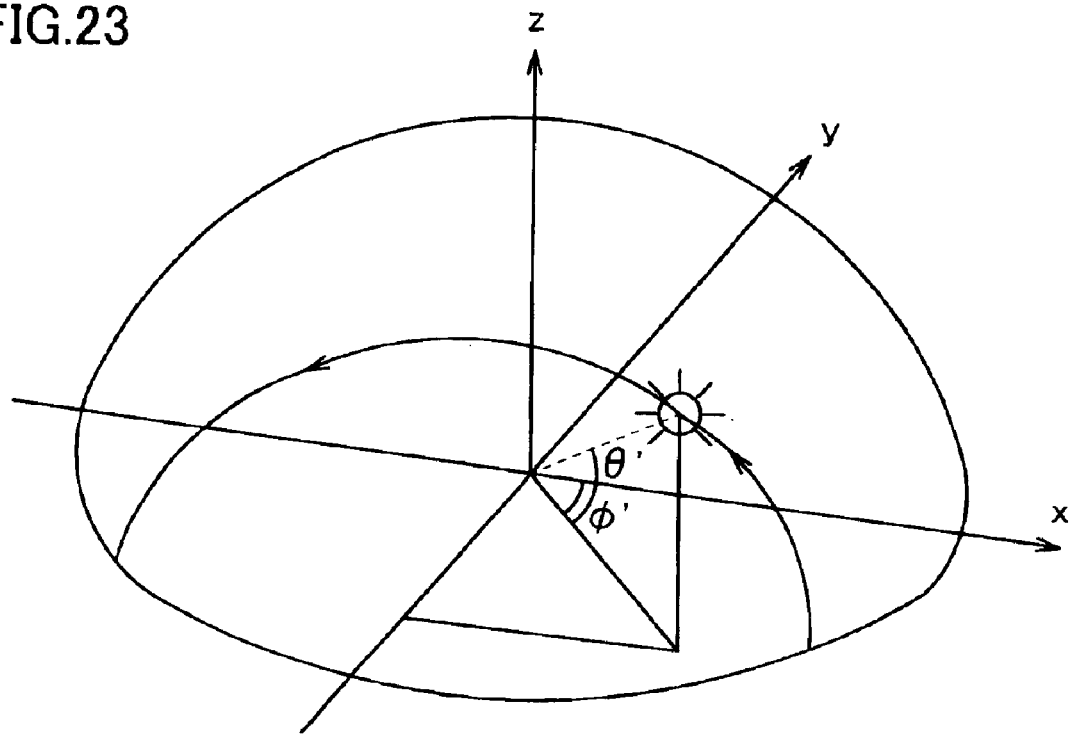
FIG. 23 is a drawing for explaining definition of a celestial coordinates system.

The relative azimuth $\phi$ and elevation angle $\theta$ of the sun as viewed from the light-receiving surface can be calculated as described below (although the following description will be made referring to the regions in the northern hemisphere, outline of the calculation is, of course, identical also for the southern hemisphere). First, a position of the sun as viewed from the equator at a given time hr of day is determined. For this purpose, a celestial sphere having a diameter of 1 is assumed as shown in FIG. 23, where the east falls in the positive x direction, the north falls in the positive y direction, and the upper vertical direction falls in the positive z direction. In this case, position (x, y, z) of the sun on the celestial sphere can be determined based on three following equations (4) through (6), where time of the meridian passage of the sun is defined as hr=12:

$$x = \sqrt{1-y^2} \cos\left(\frac{\pi}{12}(hr-6)\right) \qquad (4)$$

$$y = -\cos(\alpha) \qquad (5)$$

$$z = \sqrt{1-y^2} \sin\left(\frac{\pi}{12}(hr-6)\right) \qquad (6)$$

In the above equation, $\alpha$ represents angle of meridian passage on the dth day from January 1 (January 1 is the 1st day), and is given by the equation (7) below:

$$\alpha = 90 \times \frac{\pi}{180} + 23.45 \times \frac{\pi}{180} \sin\left(\frac{360}{365}(d-81) \times \frac{\pi}{180}\right) \qquad (7)$$

It is noted now that the orthogonal coordinate (x, y, z) and the polar coordinate in the celestial sphere (R, $\phi'$, $\theta'$) are in geometrical relations of $x=\cos\theta'\times\cos\phi'$, $y=\cos\theta\times\sin\phi'$ and $z=\sin\theta'$. Next, a position of the sun (x1, y1, z1) as viewed from a point of land at $\delta°$ latitude is determined. A position of the sun as viewed from a point of land at $\delta$ latitude equals to a position obtained by rotating the position of the sun as viewed from the equator around x axis (east-west direction) by $\delta°$, and is given by three following equations (8) through (10):

$$x1=x \qquad (8)$$

$$y1=y\cos(\delta)-z\sin(\delta) \qquad (9)$$

$$z1=y\sin(\delta)+z\cos(\delta) \qquad (10)$$

Next, a position of the sun (x2, y2, z2) as viewed from the module installed so as to face a direction $\psi°$ off-angled from due south is determined, where sign of $\psi$ is given while assuming the east direction as positive. The position of the sun in this case equals to a position obtained by rotating the position of the sun (x1, y1, z1) around z axis by $\psi°$, and is given by three following equations (11) through (13):

$$x2=x1\cos(\psi)-y1\sin(\psi) \qquad (11)$$

$$y2=x1\sin(\psi)+y1\cos(\psi) \qquad (12)$$

$$z2=z1 \qquad (13)$$

Figure 24:
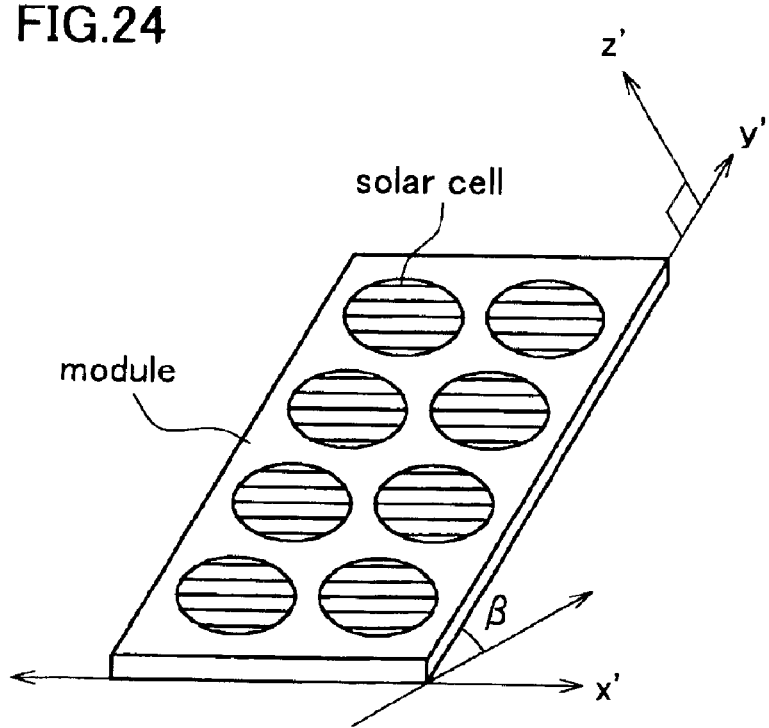
FIG. 24 is a perspective view showing relations among the longitudinal direction of the solar cell module and the grooves of the solar cells, positional relation with respect to the horizontal plane, and angle of installation.

A position of the sun (x3, y3, z3) as viewed from the solar cell module is further determined. It is assumed now, as shown in FIG. 24, that the solar cell module herein is installed so as to align the longitudinal direction of the grooves in parallel to the horizontal plane and at an installation angle of $\beta°$. It is also noted that the longitudinal direction of the grooves is defined as x' direction, the direction normal to the longitudinal direction of the grooves and in parallel to the light-receiving surface as y' direction, and the direction of the normal line on the module as z' direction. Also in this case, a position of the sun as viewed from the solar cell module equals to a position obtained by rotating the position of the sun around x' axis by $-\beta°$, and is given by three following equations (14) through (16):

$$x3=x2 \qquad (14)$$

$$y3=y2\cos(-\beta)-z2\sin(-\beta) \qquad (15)$$

$$z3=y2\sin(-\beta)+z2\cos(-\beta) \qquad (16)$$

Therefore the azimuth $\phi$ and elevation angle $\theta$ of the sun as viewed from the solar cell module can be expressed by equations (17) and (18) below using the position of the sun (x3, y3, z3):

$$\phi = \tan^{-1}\left(\frac{y3}{x3}\right) \qquad (17)$$

$$\theta = \tan^{-1}\left(\frac{z3}{\sqrt{x3^2+y3^2}}\right) \qquad (18)$$

where, the azimuth $\phi$ is defined while assuming the east aspect in the longitudinal direction of the grooves as 0, and the direction of counter-clock-wise rotation as positive. The elevation angle θ is defined as positive when the sunlight can directly be incident to the light-receiving surface of the solar cell module. As a consequence, the azimuth φ and elevation angle θ of the sun as viewed from the solar cell module can be calculated by providing the aforementioned equations (4) through (18) with five variables of latitude δ of the installation site of the module, installation angle β, installation azimuth ψ, date d, and time of day hr.

Figure 11:
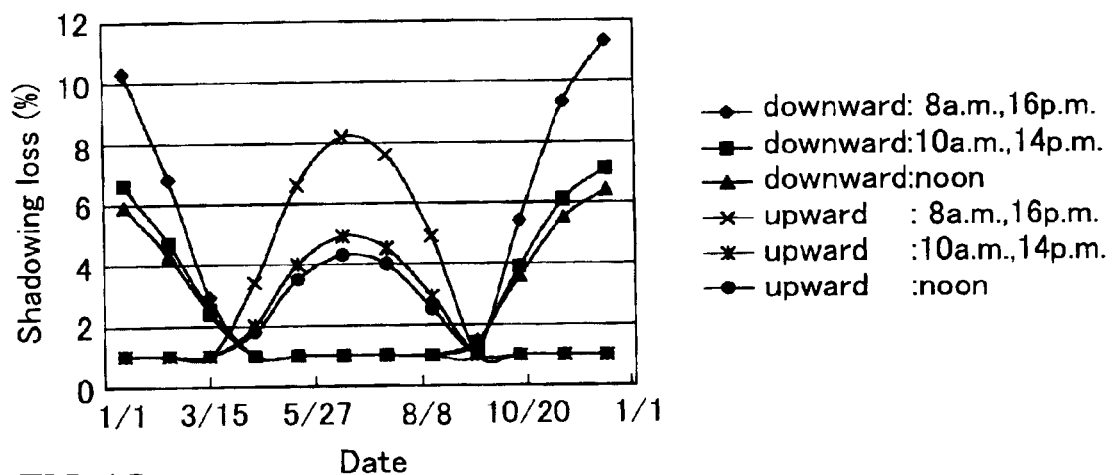
FIG. 11 is a graph showing time-depended changes in the shadowing loss for the case where the solar cell module is situated at 30° North Latitude and at an angle of installation of 25°.
Figure 12:
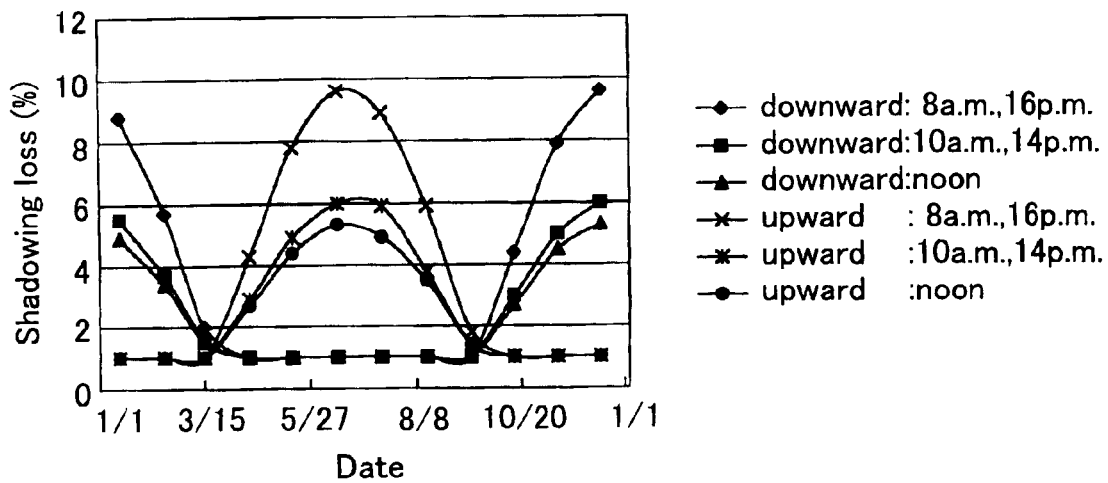
FIG. 12 is a graph showing time-depended changes in the shadowing loss for the case where the solar cell module is situated at 30° North Latitude and at an angle of installation of 30°.
Figure 13:
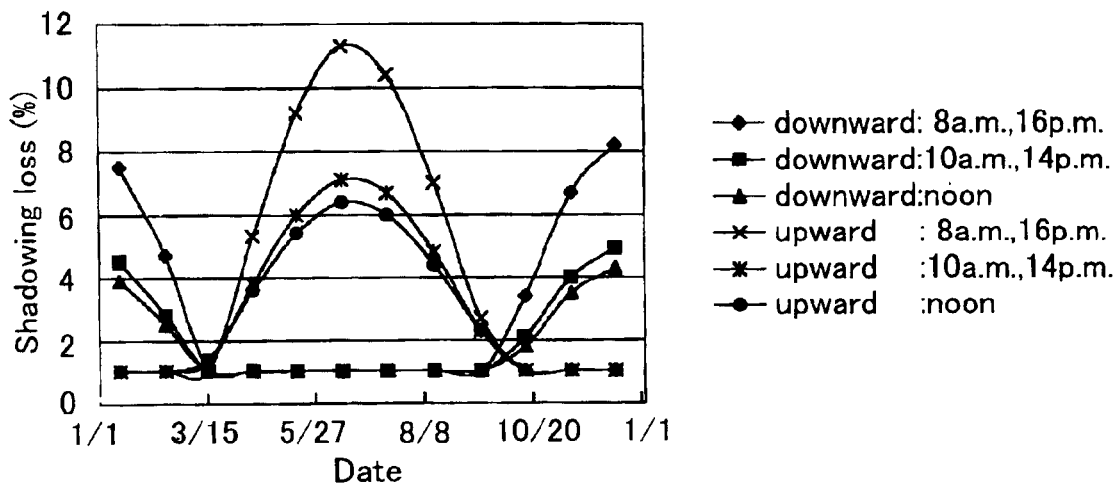
FIG. 13 is a graph showing time-depended changes in the shadowing loss for the case where the solar cell module is situated at 30° North Latitude and at an angle of installation of 35°.
Figure 14:
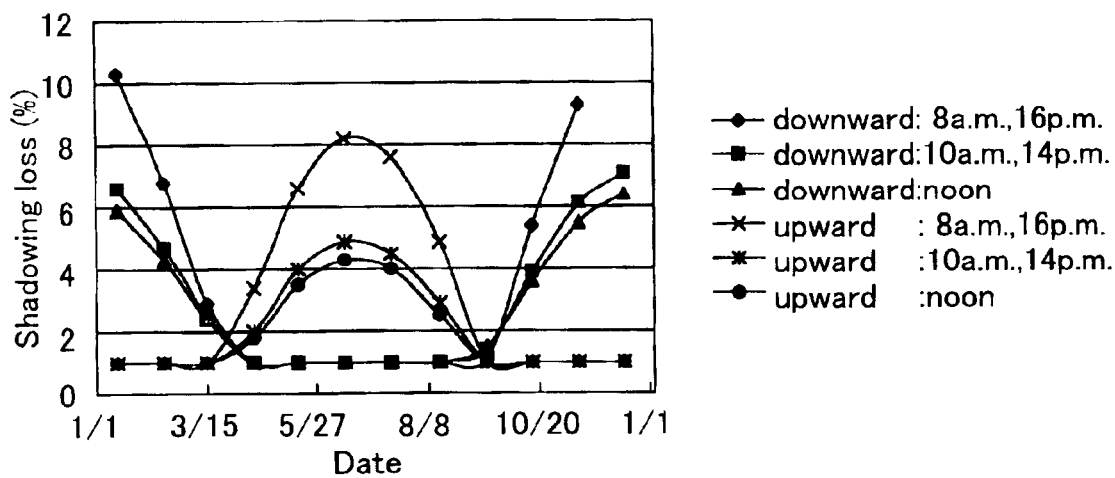
FIG. 14 is a graph showing time-depended changes in the shadowing loss for the case where the solar cell module is situated at 50° North Latitude and at an angle of installation of 45°.
Figure 15:
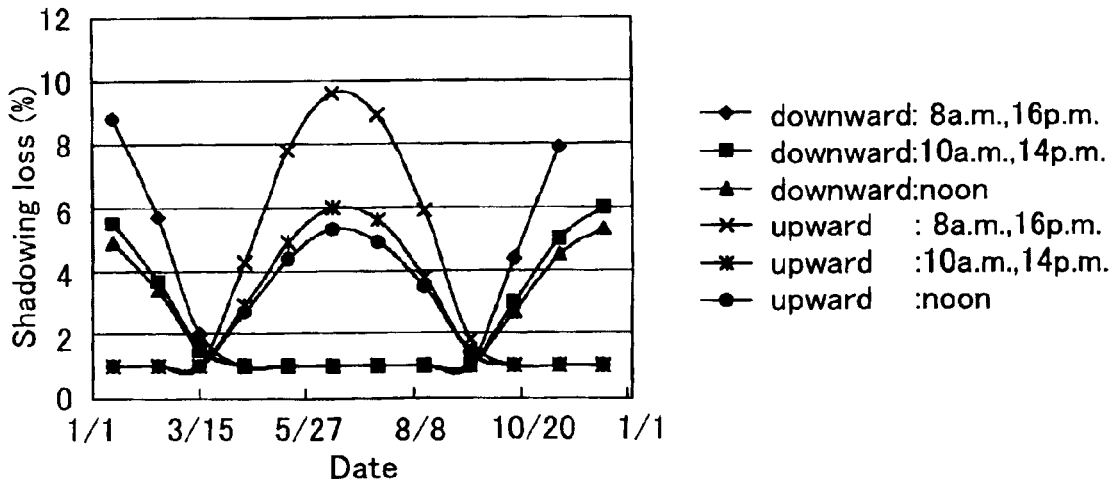
FIG. 15 is a graph showing time-depended changes in the shadowing loss for the case where the solar cell module is situated at 50° North Latitude and at an angle of installation of 50°.
Figure 16:
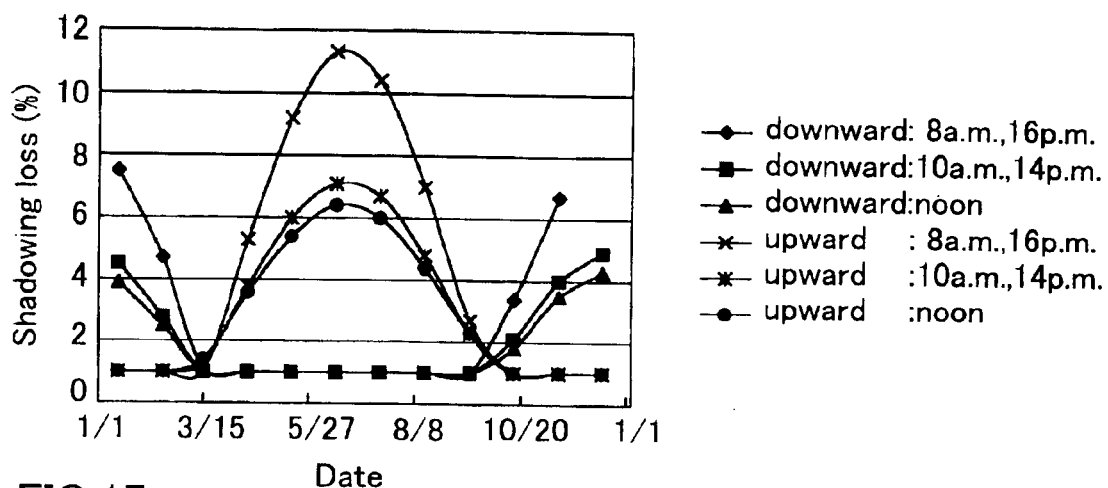
FIG. 16 is a graph showing time-depended changes in the shadowing loss for the case where the solar cell module is situated at 50° North Latitude and at an angle of installation of 55°.

Next, according to the above-described principle, calculations are made on the shadowing loss S on various date/hour throughout an year for both cases where the electrode-forming inner side faces 1 are directed upward and downward, while varying the latitude δ and installation angle β. In the best mode for carrying out the invention, representative data points were collected by observing the shadowing loss S for each time of day on 15th day of every month, which is a mid-month representative day, while fixing the installation azimuth ψ to 0, varying the latitude δ at 10° intervals, and also varying the installation angle at 5° intervals. FIGS. 11, 12 and 13 show calculated results of the shadowing loss S measured at 8 a.m., 10 a.m., 12 noon, 14 p.m. and 16 p.m. on the 15th day of every month for the cases where the solar cell module is situated at 30° latitude and at installation angles β of 25°, 30° and 35°, respectively. FIGS. 14, 15 and 16 show calculated results of the shadowing loss S measured at 8 a.m., 10 a.m., 12 noon, 14 p.m. and 16 p.m. on the 15th day of every month for the cases where the solar cell module is situated at 50° latitude and at installation angles β of 45°, 50° and 55°, respectively.

Referring now back to FIG. 9, calculation is made in step S4 to determine effective amount of received solar energy Pe after being subtracted by the shadowing loss S. It was assumed herein that solar energy density on the surface normal to the sunlight was presumed as 1 kW/m² as an average irrespective of the latitude, time of day and elevation angle of the sun. Note that only a component incident along the direction of the normal line on the module can contribute the solar energy density irradiated on the module. It was also assumed that only scattered light could reach the light-receiving surface for the case where the sunlight could not directly irradiate the module during the daytime (i.e., from sunrise to sunset), where the solar energy density was assumed constantly at 0.3 kW/m² irrespective of the angle of incidence. That is, the effective amount of received solar energy is given by a value obtained after subtracting the shadowing loss from 0.3 kW/m² irrespective of location of the sun. This is typified by a case where the sun comes behind the module 60 depending on the seasons and time zones, as shown in FIG. 7. Effective amount of received solar energy during the nighttime (from sunset to sunrise) was assumed as 0 kW/m².

Figure 17:
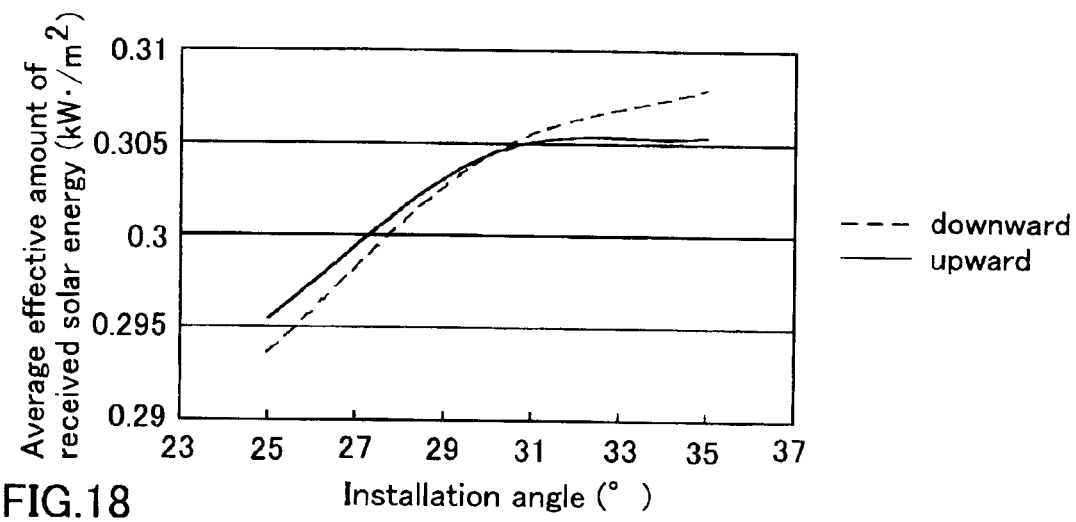
FIG. 17 is a graph showing relations between the angle of installation and average effective amount of received solar energy of the solar cell module situated at 30° North Latitude.
Figure 18:
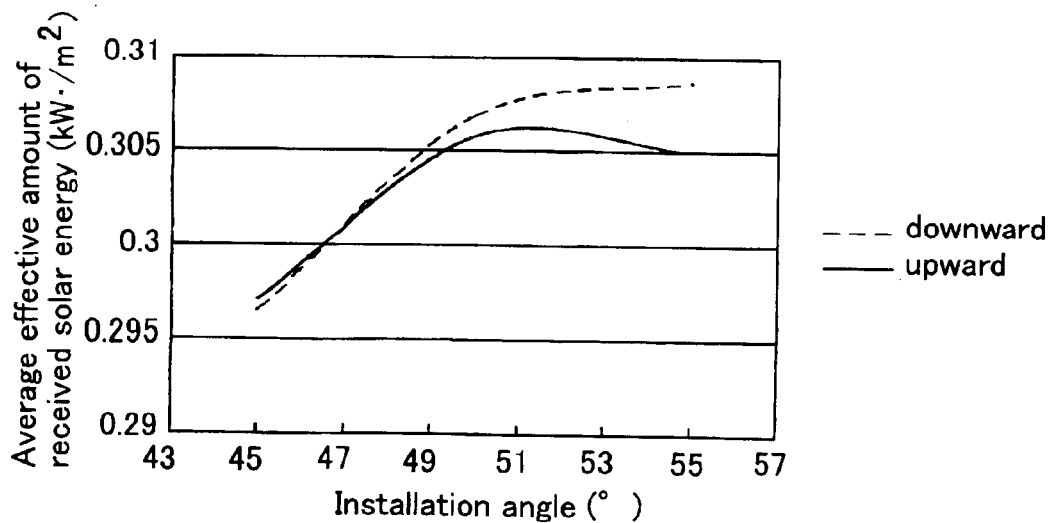
FIG. 18 is a graph showing relations between the angle of installation and average effective amount of received solar energy of the solar cell module situated at 50° North Latitude.

Next, in step S5, the effective amount of received solar energy Pe thus calculated based on the aforementioned assumptions are cumulatively counted for all time of day and then divided by all time of day, to thereby obtain average effective amount of received solar energy Pea. Moreover, in step S6, relations between the average effective amount of received solar energy Pea and installation angle β are shown in FIG. 17 (latitude δ=30°) and FIG. 18 (latitude δ=50°). As is obvious from these graphs, superiority-inferiority relation between the cases where the electrode-forming inner side faces are directed upward and downward inverts at a certain turning point, where the upward placement is advantageous in the smaller angle region, and the downward placement is advantageous in the larger angle region. It is also found that the turning point where the inversion in the superiority-inferiority relation occurs varies depending on the latitude δ. For example, the case of latitude 30° shows an angle of turning point of approx. 30°. This means that the electrode-forming inner side faces are preferably directed downward (direction of the equator) when β is larger than the angle of turning point, and directed upward (direction opposite to the equator) when β is smaller than the angle of turning point. On the other hand, the case of latitude 50° shows an angle of turning point of approx. 47°.

Referring now back to FIG. 9, calculation is then made in step S7 to determine the angle of turning point for the individual latitudes δ. Finally, S8 is performed. FIG. 10 is a graph obtained by plotting results of the calculation against latitude δ. It is found from the graph that the plot falls to zero at latitude 0° (equatorial position), which indicates that no superiority-inferiority relation is found between the upward placement and downward placement, and that the angle of turning point increases according to a sine curve as δ shifts towards the northern latitude side or towards the southern latitude side. These relations correspond to the aforementioned conditional discriminant (1) and (2). While the groove morphology of the OECO solar cell used in the calculation has a width (w1) of the projected portion 9 of 50 μm, a width (w2) of the groove of 450 μm, a depth (h) of the groove of 50 μm, and a thickness (t) of the electrode of 5 μm as shown in FIG. 19, substitution of any different values will finally give similar curves. It is to be noted that bus bar electrodes were ignored in the derivation, because the shadowing loss of the bus bar electrodes do not vary with the angle of incidence.

In the invention, total amount of annual power output obtainable from the solar cell module 60 can be increased by determining the installation direction of the electrode-forming inner side faces of the solar cell module 60 based on these discriminants, and by installing the module according thereto. It is to be noted that the discriminants of the invention are applicable from 90° North Latitude to 90° South Latitude.

It may not always be possible to ensure best position having a south aspect for installing the solar cell module 60, as shown in FIG. 20. FIG. 20 shows a case where the module must unwillingly be installed on a roof having an east aspect (having an eastward and westward slopes). In this case, the installation azimuth ψ is not equal to zero. It is therefore preferable to attach the solar cells to the support (cell holding member 10 herein) so as to direct the longitudinal direction of the grooves 8 (i.e., electrode-forming inner side faces) normal to the north-south direction (in parallel to the east-west direction). In this case, direction of the slopes of the light-receiving surfaces also lie in the east-west direction.

Figure 25:
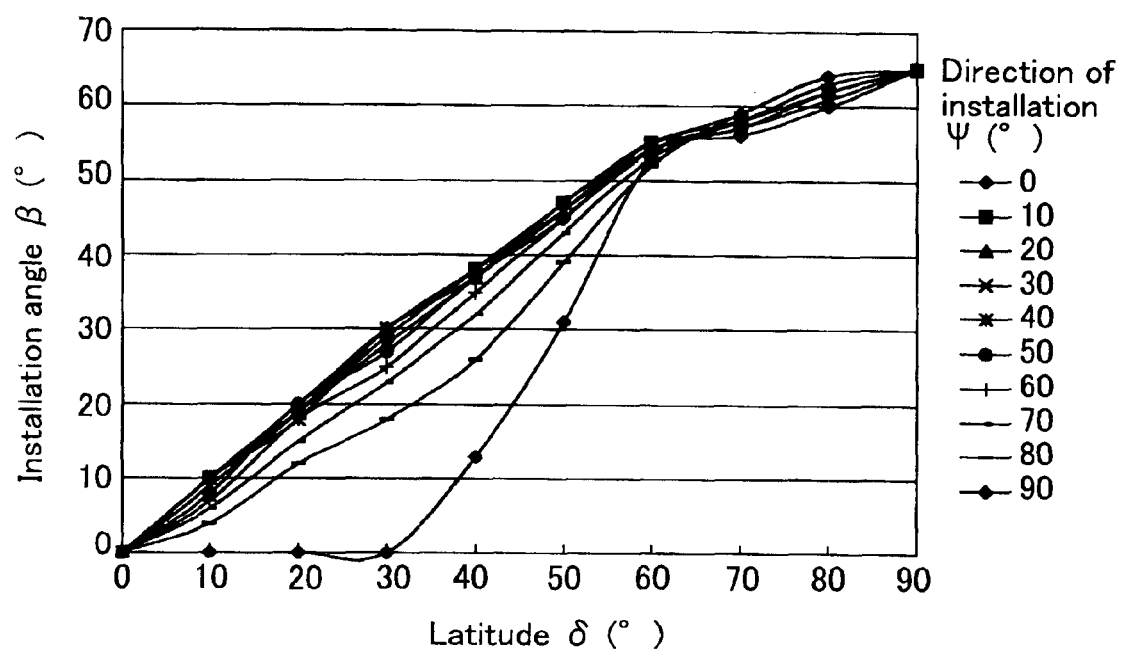
FIG. 25 is a graph showing relations among various azimuth angles $\psi$, latitude $\delta$ and turning-point angle $\beta$.

FIG. 25 shows calculated results of the installation angle β at various latitudes δ when the installation azimuth ψ is not equal to zero. It is found from the graph that no distinctive changes in relations between the installation angle β and latitude δ are observed up to an installation azimuth ψ of 65°, indicating that there will be no problem if the aforementioned discriminants (1) and (2) are applied without any modification. On the other hand, an installation azimuth ψ exceeding 65° (90° at maximum) results in considerable increase in deflection of the curves from the sine curves expressed by the right hand sides of the discriminants (1) and (2), indicating inadequacy of these discriminants as those for discriminating direction of the grooves. To cope with the cases with installation azimuth ψ exceeding 65°, the inventors then conducted curve-fitting study so as to fit a function to the points expressing the calculated results of installation angle β for various latitudes δ, and found it effective to use the discriminants below. That is, the solar cell module is preferably installed so as to direct the electrode-forming inner side faces of the grooves more closer to the equator than the other inner side faces when relation (19) below is satisfied, and vice versa when relation (20) below is satisfied. It is to be noted that, for the case where ψ is 90° (the module having an east aspect), the solar cell module is installed so as to direct the electrode-forming inner side faces of the grooves more closer to the east or downward than the other inner side faces when relation (19) below is satisfied, and vice versa when relation (20) below is satisfied. On the other hand, for the case where ψ is −90° (the module having a west aspect), the solar cell module is installed so as to direct the electrode-forming inner side faces of the grooves more closer to the west or downward than the other inner side faces when relation (19) below is satisfied, and vice versa when relation (20) below is satisfied.

$$\beta \leq -32.5 \times \cos\left(2 \times \left(\delta + \omega\left(1 - \frac{\delta}{90}\right) \times \sin(2 \times \delta)\right)\right) + 32.5 \quad (19)$$

$$\beta > -32.5 \times \cos\left(2 \times \left(\delta + \omega\left(1 - \frac{\delta}{90}\right) \times \sin(2 \times \delta)\right)\right) + 32.5 \quad (20)$$

where, $\omega = -0.0043\delta^3 + 0.9\delta^2 - 62.5\delta + 1461$.

Figure 22:
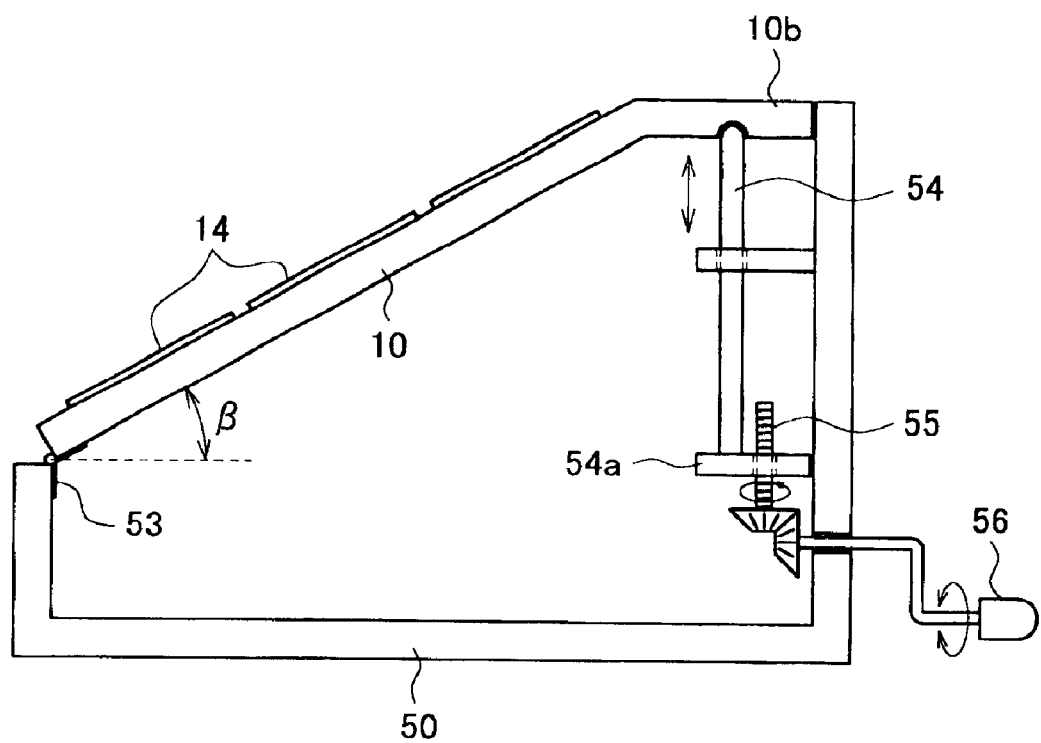
FIG. 22 is a schematic sectional view showing an exemplary solar cell unit having a variable mechanism for angle of inclination of the light-receiving surface.

As is obvious from FIG. 10, regions having higher latitudes have larger angles of turning point regarding the upward and downward orientation of the electrode-forming inner side faces. This is because the higher-latitude regions have only small angles of incidence of sunlight throughout an year, and larger angles of inclination of the light-receiving surface take larger advantages. As has been described in the above, there may be the case where the angle of inclination δ per se has an optimum value depending on latitude δ of the installation site. It is therefore allowable to configure the solar cell module of the invention so as to make the angle of inclination δ of the light-receiving surface variable as shown in FIG. 22. In the best mode for carrying out the invention shown in FIG. 22, the lower end portion of the cell holding member 10 is joined through a hinge 53 with a support 50 in a swinging manner so that the angle of inclination β can be varied by ascending or descending the upper end of the cell holding member 10 using an elevation rod 54.

The elevation rod 54 is typically configured as being integrated with a female screw 54a, where the female screw 54a is engaged with a screw axis 55, and the elevation rod 54 can be ascended or descended by rotating the screw axis 55 in the forward or reverse direction typically through operation of a handle 56.

EXAMPLE 1

The solar cell shown in FIG. 1 was fabricated by the method described below. First, on the light-receiving surface side of the p-type, single crystal silicon wafer 2 containing gallium, a Group III element, as an impurity (10 cm square, 300 μm thick, specific resistance 0.5 Ω·cm), a plurality of parallel grooves 8 having a square (rectangular) section were formed using a dicer. The groove morphology was defined, as shown in FIG. 19, by a distance (w1) between the grooves of 50 μm, a width (w2) of the groove of 450 μm, and a depth (h) of the groove of 50 μm. Damaged layer produced in the wafer was then removed by etching using an aqueous potassium hydroxide solution, and the silicon nitride film 6 was formed on the back surface using a plasma-assisted CVD apparatus.

The emitter layer 3 comprising an n+-type region was then formed on the light-receiving surface side of the silicon wafer 2 by thermally diffusing phosphorus, which is a Group V element, so as to adjust the sheet resistance to 100 Ω/□. On the back surface of the silicon wafer 2, the electrode 7 of 2 μm thick was formed by depositing aluminum by vacuum evaporation. Next, the tunnel oxide film 4 of 2 nm thick was formed on the light-receiving surface by thermal oxidation, and aluminum for forming the electrodes was succeedingly deposited by vacuum evaporation from a direction normal to the longitudinal direction of the parallel grooves and inclined 20° away from the surface of the wafer, to thereby form the electrode 5 of 5 μm thick only on one side face of each groove. Further thereon, the silicon nitride film 6 of 70 nm thick was formed over the entire surface of the light-receiving surface by plasma-assisted CVD.

Sixty similarly-fabricated OECO solar cells were then attached to the support composed of glass and Tedlar so that the electrode-forming inner side faces 1 are arranged on the same side, and so that the longitudinal directions of the grooves coincide with the bottom edge of the solar cell module, and molded with EVA (ethylene-vinyl acetate) resin into the solar cell module. A comparative solar cell module was also fabricated in which half of the solar cells were attached so that the electrode-forming inner side faces 1 are inverted by 180°. The former is referred to as Sample 1, and the latter as Sample 2 for convenience. Module area of thus fabricated solar cell modules was 666 cm², and rated output of the samples was 110 W.

Output characteristics of thus-fabricated solar cell modules were measured using a solar simulator (light intensity: 1 kW/m², spectrum: AM1.5 global). In the measurement, the light-receiving surfaces of the solar cell modules were inclined 60° away from the direction normal to the grooves. Obtained output characteristics were listed in Table 1.

TABLE 1

|  | Short-circuit current (A) | Open-circuit voltage (V) | Fill factor (%) | Maximum output (W) |
|---|---|---|---|---|
| Sample 1 | 7.0 | 17.6 | 77.1 | 95.3 |
| Sample 2 | 6.5 | 17.5 | 77.2 | 88.6 |

From the measurement results, Sample 1 was found to show short-circuit current larger by approx. 0.5 A than that of Sample 2, indicating a larger output. It is therefore to be understood that higher output is obtainable by adopting the invention.

EXAMPLE 2

As judged from the discriminants (1) and (2) of the invention, the installation at 30° North Latitude and at an installation angle of 35° can yield optimum results when the electrode-forming inner side faces are directed downward. For a demonstration purpose, the inventors installed the solar cell module fabricated in Example 1, in which all electrode-forming inner side faces 1 are unidirectionally aligned, on a roof having a slope inclined 35° away from due south in Yaku Island, Kagoshima Prefecture, Japan situated at 30°20" North Latitude, and the annual power output was measured. Samples used herein were one solar cell module having electrode-forming inner side faces directed upward and one solar cell module having those directed downward. Measurement results of the annual power output were listed in Table 2.

TABLE 2

| | Module having electrode-forming inner side face directed downward | Module having electrode-forming inner side face directed upward |
|---|---|---|
| Annual power output (kWh) | 118.7 | 117.9 |

From the measurement results, the solar cell module installed so as to direct the light-receiving inner side faces downward showed a larger annual power output than that of the solar cell module installed upward.

What is claimed is:

1. A solar cell module comprising:

a plurality of solar cells having a plurality of parallel grooves on the individual light-receiving surfaces thereof, each of the grooves having an electrode for extracting output on the inner side face (referred to as electrode-forming inner side face, hereinafter) on one side in the width-wise direction thereof; and a support for supporting the solar cells in an integrated manner so as to direct the light-receiving surfaces upward;

wherein the plurality of solar cells are attached to the support so that the longitudinal directions of the grooves nearly coincide with each other, and so that the electrode-forming inner side faces are arranged on the same side;

wherein the plurality of solar cells are attached the support so that positions of the electrode-forming inner side faces are arbitrarily selected between a first position and a second position which are in a 180°-inverted positional relation within a plane parallel to the light-receiving surface; and wherein the plurality of solar cells are collectively attached to a cell holding member, the cell holding member being attached to an installation base as the support with the aid of a detachable joining mechanism, and being configured so that variation in the direction of attachment of the cell holding member to the installation base results in positional changes in the electrode-forming inner side faces of the plurality of solar cells collectively between the first position and the second position.

2. The solar cell module as claimed in claim 1, wherein the grooves have any section of rectangular, semicircular and triangular forms.

3. A method of installing a solar cell module at an installation site, wherein the cell module comprises a plurality of solar cells having a plurality of parallel grooves on the individual light-receiving surfaces thereof, each of the grooves having an electrode for extracting output on the inner side face (referred to as electrode-forming inner side face, hereinafter) on one side in the width-wise direction thereof; and a support for supporting the solar cells in an integrated manner so as to direct the light-receiving surfaces comprising the steps of attaching the plurality of solar cells to the support so that the longitudinal directions of the grooves nearly coincide with each other, and so that the electrode-forming inner side faces are arranged on the same side;

adjusting the direction of arrangement of the electrode-forming inner side faces of the grooves of the individual solar cells depending on the angle of inclination $\beta$ of the light-receiving surfaces of the as-installed individual solar cells away from the horizontal plane, and on the latitude $\delta$ of the installation site of the solar cell module;

attaching the plurality of solar cells to the support so that positions of the electrode-forming inner side faces are arbitrarily selected between a first position and a second position which are in a 180°-inverted positional relation within a plane parallel to the light-receiving surface; and collectively attaching the plurality of solar cells are to a cell holding member, the cell holding member being attached to an installation base as the support with the aid of a detachable joining mechanism, and being configured so that variation in the direction of attachment of the cell holding member to the installation base results in positional changes in the electrode-forming inner side faces of the plurality of solar cells collectively between the first position and the second position.

4. The method of installing the solar cell module as claimed in claim 3, wherein the solar cell module is installed so as to horizontally align the longitudinal direction of the grooves formed on the individual solar cells, and assuming that the angle of inclination of the light-receiving surface away from the horizontal plane as $\beta°$, and that the latitude of the installation site as $\delta°$ (where, the north latitude side is defined as positive), the solar cell module is also installed so as to direct the electrode-forming inner side faces of the grooves more closer to the equator than the other inner side faces when the relation of $$\beta \leq 60 \times |\sin \delta|$$

is satisfied, and the solar cell module is also installed so as to direct the other inner side faces of grooves more closer to the equator than the electrode-forming inner side faces when the relation of $$\beta > 60 \times |\sin \delta|$$

is satisfied.

5. The solar cell module as claimed in claim 1, wherein the grooves have any section of and, semicircular forms.

6. A method of installing the solar cell module as claimed in claim 1, at an installation site, comprising adjusting the direction of arrangement of the electrode-forming inner side faces of the grooves of the individual solar cells depending on the angle of inclination $\beta$ of the light-receiving surfaces of the as-installed individual solar cells away from the horizontal plane, and on the latitude $\delta$ of the installation site of the solar cell module.

7. A method of installing the solar cell module as claimed in claim 2, at an installation site, comprising adjusting the direction of arrangement of the electrode-forming inner side faces of the grooves of the individual solar cells depending on the angle of inclination $\beta$ of the light-receiving surfaces of the as-installed individual solar cells away from the horizontal plane, and on the latitude $\delta$ of the installation site of the solar cell module.

8. A method of installing the solar cell module as claimed in claim 5, at an installation site, comprising adjusting the direction of arrangement of the electrode-forming inner side faces of the grooves of the individual solar cells depending on the angle of inclination $\beta$ of the light-receiving surfaces of the as-installed individual solar cells away from the horizontal plane, and on the latitude $\delta$ of the installation site of the solar cell module.

9. The method of installing the solar cell module as claimed in claim 6, wherein the solar cell module is installed so as to horizontally align the longitudinal direction of the grooves formed on the individual solar cells, and assuming that the angle of inclination of the light-receiving surface away from the horizontal plane as β°, and that the latitude of the installation site as δ° (where, the north latitude side is defined as positive), the solar cell module is also installed so as to direct the electrode-forming inner side faces of the grooves more closer to the equator than the other inner side faces when the relation of $$\beta \leq 60 \times |\sin \delta|$$

is satisfied, and the solar cell module is also installed so as to direct the other inner side faces of grooves more closer to the equator than the electrode-forming inner side faces when the relation of $$\beta > 60 \times |\sin \delta|$$

is satisfied.

10. The method of installing the solar cell module as claimed in claim 7, wherein the solar cell module is installed so as to horizontally align the longitudinal direction of the grooves formed on the individual solar cells, and assuming that the angle of inclination of the light-receiving surface away from the horizontal plane as β°, and that the latitude of the installation site as δ° (where, the north latitude side is defined as positive), the solar cell module is also installed so as to direct the electrode-forming inner side faces of the grooves more closer to the equator than the other inner side faces when the relation of $$\beta \leq 60 \times |\sin \delta|$$

is satisfied, and the solar cell module is also installed so as to direct the other inner side faces of grooves more closer to the equator than the electrode-forming inner side faces when the relation of $$\beta > 60 \times |\sin \delta|$$

is satisfied.

11. The method of installing the solar cell module as claimed in claim 8, wherein the solar cell module is installed so as to horizontally align the longitudinal direction of the grooves formed on the individual solar cells, and assuming that the angle of inclination of the light-receiving surface away from the horizontal plane as β°, and that the latitude of the installation site as δ° (where, the north latitude side is defined as positive), the solar cell module is also installed so as to direct the electrode-forming inner side faces of the grooves more closer to the equator than the other inner side faces when the relation of $$\beta \leq 60 \times |\sin \delta|$$

is satisfied, and the solar cell module is also installed so as to direct the other inner side faces of grooves more closer to the equator than the electrode-forming inner side faces when the relation of $$\beta > 60 \times |\sin \delta|$$

is satisfied.

\* \* \* \* \*